(12) United States Patent
Shi et al.

(10) Patent No.: US 12,040,592 B2
(45) Date of Patent: Jul. 16, 2024

(54) PACKAGING SUBSTRATE WITH LOW THERMAL RESISTANCE AND LOW PARASITIC INDUCTANCE

(71) Applicant: Lumentum Operations LLC, San Jose, CA (US)

(72) Inventors: Wei Shi, San Jose, CA (US); Hao Huang, San Jose, CA (US); Siu Kwan Cheung, San Jose, CA (US); Huanlin Zhu, San Jose, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 209 days.

(21) Appl. No.: 17/445,786

(22) Filed: Aug. 24, 2021

(65) Prior Publication Data

US 2022/0385033 A1  Dec. 1, 2022

Related U.S. Application Data

(60) Provisional application No. 63/202,153, filed on May 28, 2021.

(51) Int. Cl.
| | |
|---|---|
| *H01S 5/024* | (2006.01) |
| *H01L 23/373* | (2006.01) |
| *H01L 23/498* | (2006.01) |
| *H01S 5/02315* | (2021.01) |
| *H01S 5/183* | (2006.01) |

(52) U.S. Cl.
CPC ...... *H01S 5/02469* (2013.01); *H01L 23/3735* (2013.01); *H01L 23/49827* (2013.01); *H01L 23/49833* (2013.01); *H01S 5/02315* (2021.01); *H01S 5/183* (2013.01)

(58) Field of Classification Search
CPC .. H01S 5/183; H01S 5/02315; H01S 5/02469; H01L 23/49833; H01L 23/49827; H01L 23/2735
USPC ........................................................ 174/252
See application file for complete search history.

(56) References Cited

U.S. PATENT DOCUMENTS

| | | | |
|---|---|---|---|
| 2010/0006330 A1* | 1/2010 | Fu | H01L 24/19 29/856 |
| 2021/0217684 A1* | 7/2021 | Shih | H01L 21/76807 |

* cited by examiner

*Primary Examiner* — Tremesha S Willis
(74) *Attorney, Agent, or Firm* — Harrity & Harrity, LLP (57) ABSTRACT

A substrate may include a thermally conductive metal core having a top side and a bottom side, a first dielectric coating on the top side of the metal core, a second dielectric coating on the bottom side of the metal core, a first metal circuit layer formed above the first dielectric coating, and a second metal circuit layer formed under the second dielectric coating. In some implementations, the first dielectric coating and the second dielectric coating have thicknesses below sixty micrometers and respective thermal resistances under fifteen degrees Celsius per watt. In some implementations, one or more electrical currents flowing vertically across a dielectric coating have a low parasitic inductance based on the thickness of the dielectric coating, and the metal core may dissipate heat flowing across the dielectric coating and into the metal core.

20 Claims, 6 Drawing Sheets

PACKAGING SUBSTRATE WITH LOW THERMAL RESISTANCE AND LOW PARASITIC INDUCTANCE

CROSS-REFERENCE TO RELATED APPLICATION

This patent application claims priority to U.S. Provisional Patent Application No. 63/202,153, filed on May 28, 2021, and entitled "PACKAGING SUBSTRATE WITH LOW THERMAL RESISTANCE AND LOW PARASITIC INDUCTANCE." The disclosure of the prior application is considered part of and is incorporated by reference into this patent application.

TECHNICAL FIELD

The present disclosure relates generally to a packaging substrate and to a substrate or submount in which a metal core or metal base block used for heat dissipation is electrically isolated from one or more metal circuit layers by a thin dielectric coating or a thin dielectric layer that has a low thermal resistance and a low parasitic inductance.

BACKGROUND

In electromagnetism, a dielectric or dielectric material is an electrical insulator or a very poor conductor of electric current that can be polarized by an applied electric field. When a dielectric material is placed in an electric field, electric charges do not flow through the dielectric material in the same way that electric charges flow through an electric conductor (e.g., metal) because dielectric materials have no loosely bound or free electrons that may drift through the dielectric material. Instead, in a dielectric material, electric charges only slightly shift from average equilibrium positions, causing dielectric polarization. For example, positive charges within the dielectric material are displaced minutely in a direction of the electric field, and negative charges are displaced minutely in a direction opposite to the electric field. The slight separation of charge (or polarization) reduces the electric field within the dielectric material such that practically no electric current flows in the dielectric material.

SUMMARY

In some implementations, a substrate includes a thermally conductive metal core having a top side and a bottom side; a first dielectric coating on the top side of the metal core; a second dielectric coating on the bottom side of the metal core, wherein the first dielectric coating and the second dielectric coating have respective thicknesses that are less than sixty micrometers (μm), and wherein the first dielectric coating and the second dielectric coating have respective thermal resistances that are less than fifteen degrees Celsius per watt (C/W); a first metal circuit layer formed above the first dielectric coating; and a second metal circuit layer formed under the second dielectric coating, wherein one or more electrical currents flowing vertically across one or more of the first dielectric coating or the second dielectric coating or horizontally along one or more of the metal core, the first metal circuit layer, or the second metal circuit layer have a low parasitic inductance based on the respective thicknesses of the first dielectric coating and the second dielectric coating, and wherein the metal core dissipates heat that flows across one or more of the first dielectric coating or the second dielectric coating and into the metal core.

In some implementations, a substrate includes a metal core having a top side and a bottom side; a first set of metal circuit layers formed above the top side of the metal core; and a second set of metal circuit layers formed below the bottom side of the metal core, wherein each metal circuit layer in the first set of metal circuit layers and the second set of metal circuit layers is separated from at least one of the metal core or an adjacent metal layer by a dielectric layer having a thickness that is less than twenty-five μm and a thermal resistance under fifteen C/W, and wherein electrical current and heat flows vertically through the substrate.

In some implementations, a package includes a substrate that includes a cavity; and a submount, bonded to the substrate in the cavity, wherein the submount includes: a metal base block; a dielectric coating on a top side of the metal base block, wherein the dielectric coating has a thickness that is less than sixty μm, and a metal circuit layer formed above the dielectric coating, wherein electrical current and heat flows vertically through the submount.

DETAILED DESCRIPTION

The following detailed description of example implementations refers to the accompanying drawings. The same reference numbers in different drawings may identify the same or similar elements.

Figure 1:
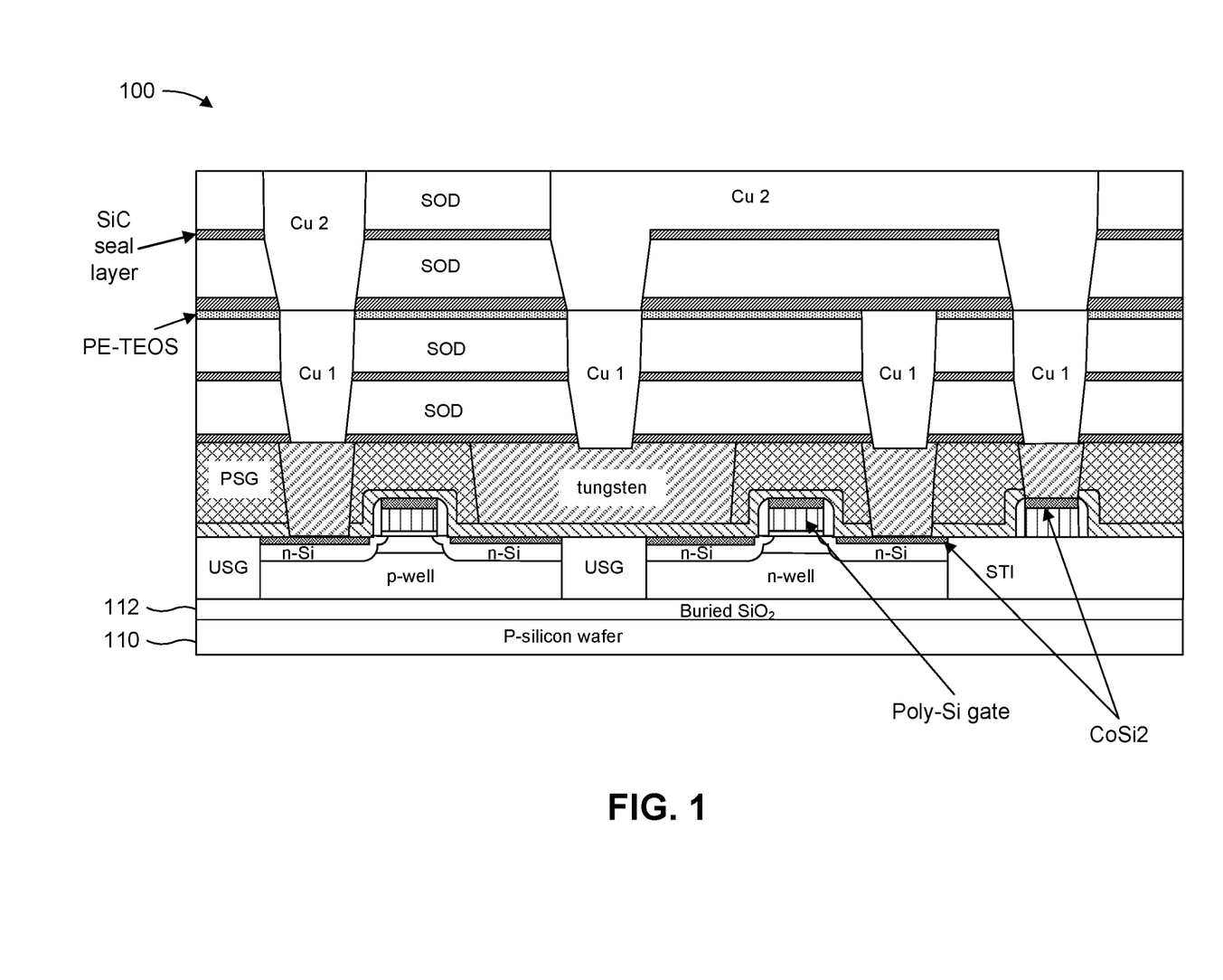
FIG. 1 is a diagram illustrating an example of a complementary metal-oxide-semiconductor (CMOS) chip.

In a conventional integrated circuit (IC) chip, a top side is typically designed for electrical connection to one or more electrodes and/or a ball grid array (BGA) by wire bond, solder balls, and/or other suitable elements, and a bottom side is electrically isolated such that a substrate under a silicon chip area can be designed purely for heat dissipation. For example, FIG. 1 illustrates an example 100 of a complementary metal-oxide-semiconductor (CMOS) chip in which electrical current does not flow down to a silicon wafer 110 because a buried silicon dioxide ($SiO_2$) layer 112 electrically isolates the silicon wafer 110. Accordingly, the bottom side of the IC chip is electrically insulated in conventional IC chip designs, and electric current flows out one surface (e.g., the top surface) rather than vertically through the IC chip.

Figure 2:
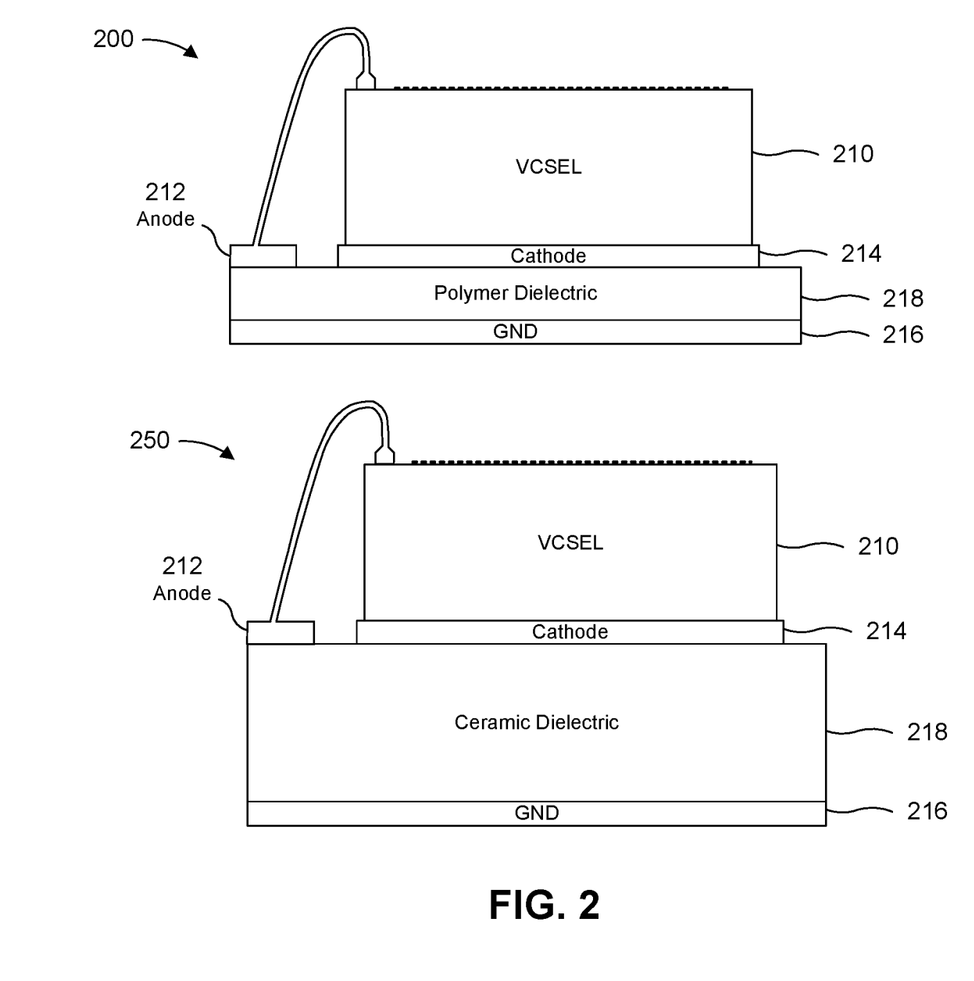
FIG. 2 is a diagram illustrating examples of top-emitting vertical-cavity surface-emitting laser (VCSEL) chips.

In contrast, a vertical-cavity surface-emitting laser (VCSEL) chip is generally designed to emit a laser beam in a direction perpendicular to a substrate surface (e.g., vertically from a surface of a semiconductor wafer), which differs from conventional IC chip designs in that electrical current and heat both flow from a top surface of the VCSEL chip to the bottom surface and then to a die pad or cathode layer. For example, FIG. 2 is a diagram illustrating examples 200, 250 of top-emitting VCSEL chips. As shown in FIG. 2, and by examples 200, 250, a top-emitting VCSEL chip generally includes a VCSEL 210 that emits a laser beam in a vertical direction, an anode 212, a cathode 214, a ground layer 216, and a dielectric layer 218 that separates the anode 212 and the cathode 214 from the ground layer 216. For example, as shown in FIG. 2, electric current flows from the anode 212 to the top surface of the VCSEL 210, vertically through the VCSEL 210 to the cathode 214, and then horizontally through the cathode 214 to a neighboring controller, an IC driver, and/or another suitable component (not shown). Accordingly, because both heat and electrical current flow vertically through the VCSEL 210 from the anode 212 to the cathode 214, the underlying substrate needs to have at least two metal layers.

For example, in the underlying substrate design, the cathode 214 is needed to enable electric current to flow through the VCSEL 210 to the neighboring controller, IC driver, and/or other suitable component(s), and the ground layer 216 is needed under the cathode 214 to support high-speed signals. Accordingly, the dielectric layer 218 is needed to electrically insulate the electric current that flows horizontally through the cathode 214 and to separate the cathode 214 from a heat dissipation pad on the substrate bottom (e.g., because the heat dissipation pad is typically electrically grounded and cannot be connected to the cathode 214 directly). However, the dielectric layer 218 that is needed between the cathode 214 and the ground layer 216 poses various design challenges. In particular, because both heat and electric current flow vertically through the VCSEL 210, the dielectric layer 218 needs to provide electrical insulation for the electric current, and the dielectric layer 218 further needs to have a low thermal resistance such that a heat dissipation pad (not shown) under the ground layer 216 can dissipate and/or spread the heat that flows vertically through the VCSEL 210.

For example, in FIG. 2, example 200 depicts a VCSEL chip in which the dielectric layer 218 is made from a polymer dielectric material, such as flame retardant 4 (FR4 or FR-4), which is a flame resistant or self-extinguishing composite material made from woven fiberglass cloth with an epoxy resin binder. In such cases, when the dielectric layer 218 is made from a polymer dielectric such as FR4, the dielectric layer 218 has a very low thermal conductivity (e.g., approximately 0.3 to approximately 0.7 watts per meter-kelvin (W/mK)). As a result, even if advanced substrate technology were to be used to form the dielectric layer 218 with a minimum thickness for the chosen polymer dielectric material (e.g., 25 micrometers (μm) for FR4) to optimize electrical performance (e.g., by minimizing parasitic inductance across the dielectric layer 218, between the cathode 214 and the ground layer 216), the low thermal conductivity of the polymer dielectric material results in a high thermal resistance (e.g., 46.61 degrees Celsius per watt (C/W) for FR4). In other words, the very high thermal resistance of polymer dielectric materials blocks the dissipation and/or spreading of heat that flows vertically through the VCSEL 210, which in turn downgrades optical output power from the VCSEL 210.

Alternatively, example 250 in FIG. 2 depicts a VCSEL chip in which the dielectric layer 218 is made from a ceramic material (e.g., aluminum nitride (AlN) or aluminum oxide ($Al_2O_3$)). In such cases, the thermal conductivity of the ceramic dielectric material may be somewhat higher than the thermal conductivity of a polymer dielectric material (e.g., 130 W/mK for AlN or 15 W/mK for $Al_2O_3$ at a typical VCSEL operating temperature). However, in such cases, the dielectric layer 218 may have a large thickness (e.g., a minimum thickness of 100 μm for AlN, or a minimum thickness of 70 μm for $Al_2O_3$) due to substrate manufacturing constraints. Accordingly, thermal resistance is not significantly reduced due to the very large thickness of the dielectric layer 218, which also increases parasitic inductance to a higher level that has an impact on high-speed signal quality (e.g., by degrading high-speed modulation performance). In other words, although ceramic dielectric materials such as AlN and $Al_2O_3$ generally have better thermal conductivity (lower thermal resistance) than polymer dielectric materials such as FR4, the large thickness of the dielectric layer 218 in example 250 results in suboptimal thermal performance (e.g., insufficient heat spreading and dissipation) and suboptimal electrical performance (e.g., a very high parasitic inductance).

Accordingly, existing substrates that are typically used in the IC packaging industry suffer from drawbacks less than ideal for use with a VCSEL chip where heat and electrical current flow vertically through the VCSEL chip, because the dielectric layer 218 used in the VCSEL chip are typically made from dielectric materials that have a high thermal resistance and/or dielectric materials that have a large minimum thickness that leads to a higher parasitic inductance. Furthermore, the drawbacks associated with existing dielectric materials are worse for VCSEL chips that are operated using high-speed signals, which generally requires more power, thereby resulting in more heat to be dissipated and/or spread and/or greater sensitivity to parasitic inductance. Furthermore, although some thin dielectric coating systems allow inorganic materials (e.g., aluminum oxynitride (AlON), AlN, aluminum phosphate ($AlPO_4$), and/or $Al_2O_3$) to be used as a coating material, these materials are usually incompatible with lamination processes used in the polymer dielectric (e.g., FR4) substrate industry and with co-firing processes used in the high temperature co-fired ceramic (HTCC) substrate industry.

Some implementations described herein relate to one or more substrate designs in which a metal core is separated from one or more metal circuit layers by one or more thin dielectric layers (or dielectric coatings) that may have a thickness between approximately 0.2 μm and approximately 60 μm. For example, in some implementations, a substrate may include a conductive core, which may be made from a metal that has a high thermal conductivity (e.g., copper, copper-tungsten, or aluminum) to enable heat dissipation or spreading, one or more metal circuit layers above the core and one or more metal circuit layers below the metal core, and a thin dielectric layer that separates each metal circuit layer from the metal core and/or an adjacent metal circuit layer. The dielectric coating layers may generally have a thickness less than approximately 60 μm and may have a thickness that is less than 25 μm in the case of AlON, AlN, or $AlPO_4$ (e.g., going as low as 0.2 to 5 μm for $AlPO_4$), which may result in a low parasitic inductance. Furthermore, the dielectric coating layers may be made from a dielectric material (e.g., AlON, AlN, $AlPO_4$, and/or $Al_2O_3$) that has a low thermal resistance (e.g., when the dielectric coating layers have a thickness of approximately 60 μm or less). In some implementations, one or more vias may be formed in the substrate by laser drilling, dielectric-epoxy filling, and copper (Cu) filling, which may be followed by Cu plating and patterning on the top and bottom surfaces. In some implementations, the one or more vias may provide an interconnect from a metal circuit layer to the metal core, may provide an interconnect that is isolated from the metal core by additional dielectric materials in the via(s) to connect metal circuit layers above and below the metal core, and/or may provide an interconnect between two metal circuit layers on the same side of the metal core (e.g., a first and second metal circuit layer above the metal core and/or a first and second metal circuit layer above the metal core) in cases where there are multiple metal circuit layers above or below the metal core.

Additionally, or alternatively, some implementations described herein relate to an integrated circuit package structure (e.g., a multi-layer hybrid substrate) including a submount that can be used as a grounding layer and a heat dissipation layer. For example, in some implementations, the submount may be packaged into or otherwise bonded to an organic substrate (e.g., an FR4 substrate) and/or an inorganic substrate (e.g., an HTCC substrate) that includes a cavity to receive the submount and an open window to emit a laser beam in a vertical direction. In some implementations, the submount may include a metal base block, a single metal circuit layer above the metal base block, and a thin dielectric layer or dielectric coating on a top surface of the metal base block to provide electrical isolation between the metal base block and the metal circuit layer. In some implementations, a single metal layer (1ML) may be separated from the bottom base block by a dielectric coating layer having a thickness between approximately 0.2 µm and approximately 60 µm, which may result in a low parasitic inductance, and the dielectric coating layer may be made from a dielectric material that has a low thermal resistance.

In this way, some implementations described herein relate to one or more substrate designs and one or more package (e.g., hybrid substrate) designs that may satisfy thermal and electrical performance requirements in circuits where heat and electrical current flows vertically across different metal layers. For example, as described herein, a dielectric layer used to electrically isolate a metal circuit layer (e.g., a cathode) that receives an electrical signal from a grounded heat dissipation pad used to spread and/or dissipate heat may be designed to have a low parasitic inductance and a low thermal resistance. For example, because the dielectric layer is ultra-thin (e.g., generally less than 60 µm, and potentially as thin as 0.2 µm), the dielectric layer is associated with a low parasitic inductance (e.g., because the parasitic inductance is proportional to a size of a current loop formed across the dielectric layer and vertically between two metal layers, whereby a thinner dielectric layer reduces parasitic inductance by reducing the size of the current loop). Furthermore, because the dielectric layer is thin and made from a dielectric material with a low thermal resistance, the dielectric layer does not interfere with the heat spreading and/or heat dissipation properties of the metal core in the substrate design(s) described herein or the metal base block in the package design(s) described herein. For example, the following table indicates thermal resistance and parasitic inductance properties for various dielectric materials, including FR4 and AlN layers with a minimum thickness of 100 µm which suffer from degraded optical output power due to high thermal resistance, poor high-speed signal quality due to a large thickness increasing electrical capacitance, and/or incompatibility with lamination, co-firing, and/or other manufacturing processes used in the substrate industry. In addition, the following table indicates thermal resistance and parasitic inductance properties for AlON that may be grown to a 20 µm thickness on a top surface and a bottom surface of a metal core, where AlON grown on copper (Cu) or copper-tungsten (CuW) exhibits comparable thermal resistance as AlN but a much lower parasitic inductance due to the very small thickness.

TABLE 1

Thermal resistance and parasitic inductance for different dielectric materials

| Dielectric material; Thickness | Thermal resistance | Parasitic inductance |
|---|---|---|
| FR4; 25 µm | 46.61 C/W | Medium |
| AlN; 100 µm | 12.92 C/W | High |
| AlPO$_4$; 2 × 0.5 µm (on 100 µm Cu) | 12.33 C/W | Low |
| AlON; 2 × 20 µm (on 100 µm Cu) | 12.58 C/W | Low |
| AlON; 2 × 20 µm (on 100 µm CuW) | 12.78 C/W | Low |

Figure 3A:
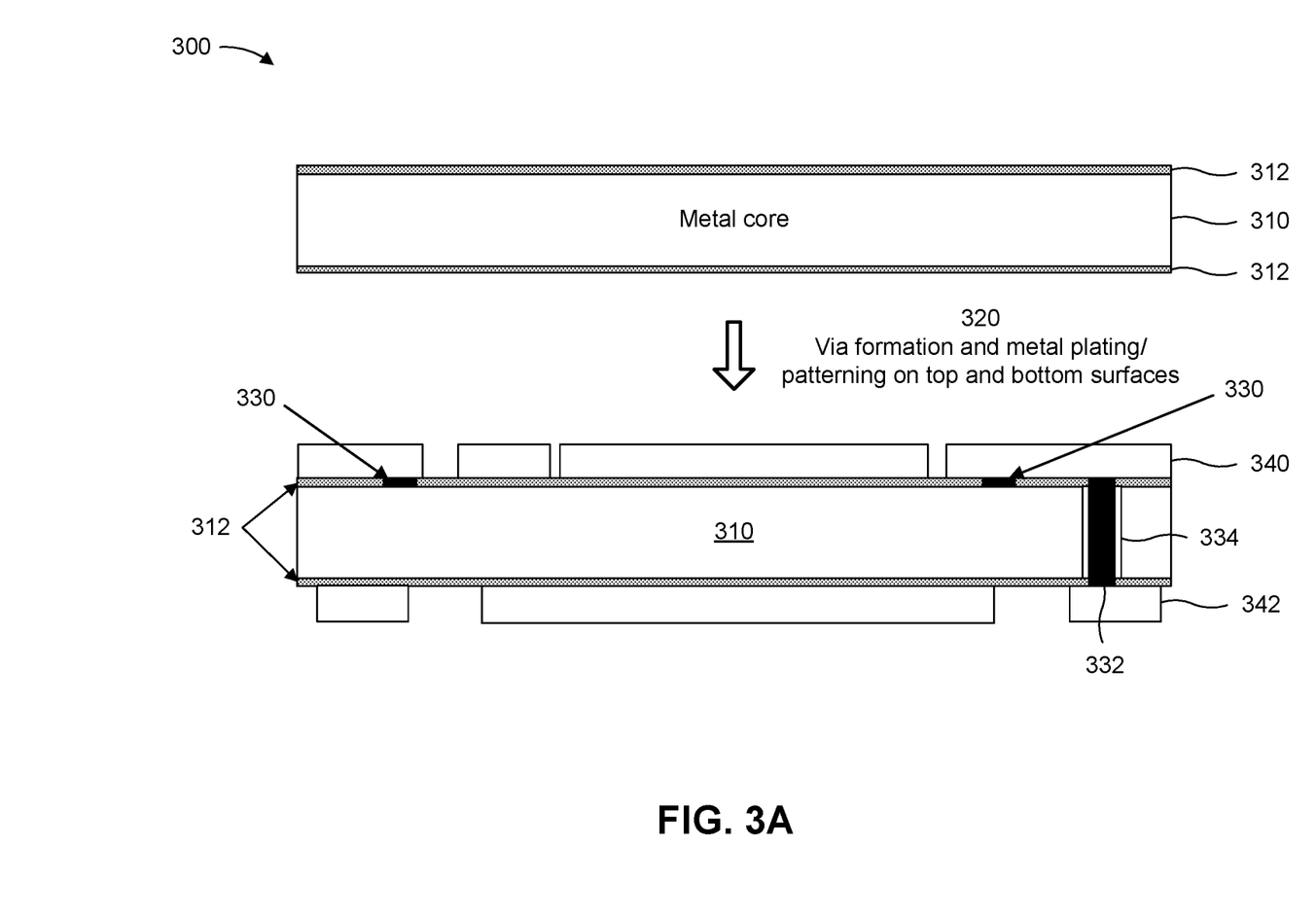
FIGS. 3A-3B are diagrams illustrating example implementations of substrates with a low thermal resistance and a low parasitic inductance.
Figure 3B:
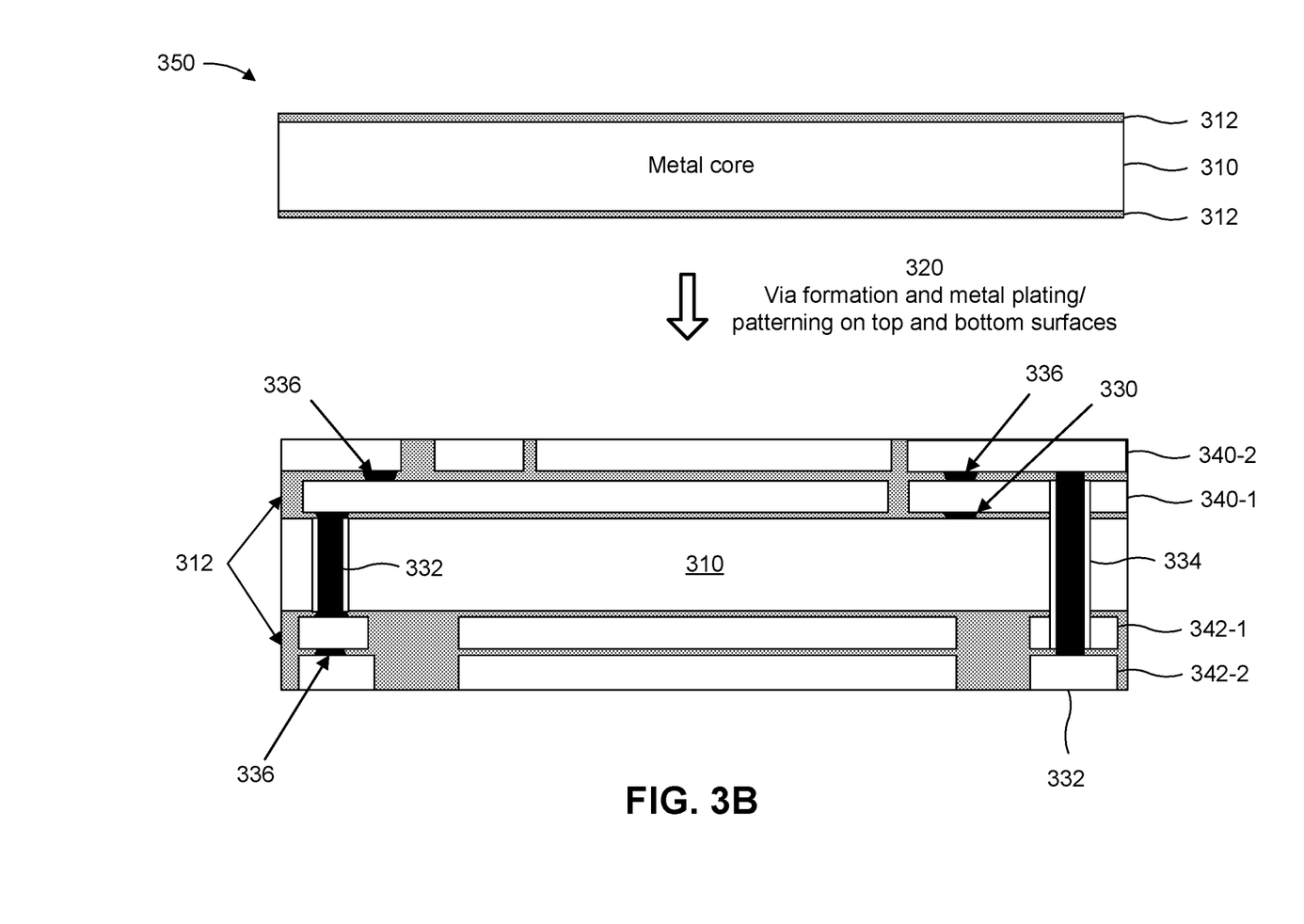

FIGS. 3A-3B are diagrams illustrating example implementations 300, 350 of substrates with a low thermal resistance and a low parasitic inductance.

For example, in FIG. 3A, implementation 300 is an example of a two-metal-layer (2ML) metal-core substrate in which a starting structure includes a thermally conductive metal core 310 that has a top side with a first dielectric coating 312 and a bottom side with a second dielectric coating 312 (e.g., 2× dielectric coating 312 on metal core 310, as in the first column of Table 1). In some implementations, as described herein, the first dielectric coating 312 and the second dielectric coating 312 may include a dielectric material that can be grown on the metal core 310 to a thickness in a range between approximately 0.2 µm and approximately 60 µm. For example, in some implementations, the dielectric material may include AlPO$_4$, in which case the dielectric coatings 312 have respective thicknesses between approximately 0.2-5 µm, AlON or AlN, in which case the dielectric coatings 312 have respective thicknesses between approximately 10-20 µm, or Al$_2$O$_3$, in which case the dielectric coatings 312 have respective thicknesses less than approximately 60 µm, although other dielectric materials and corresponding thicknesses may be used. Accordingly, because the dielectric coatings 312 are very thin (e.g., less than approximately 60 µm, and potentially as low as 0.2 µm in the case of AlPO$_4$), the dielectric coatings 312 may be associated with a very low parasitic inductance, which is mainly impacted by the thickness of the dielectric coatings 312. For example, due to the dielectric coatings 312 having a thickness of less than approximately 60 µm, a first current loop between the metal core 310 and a metal layer 340 formed above the metal core 310 (across the top dielectric coating 312) and a second current loop between the metal core 310 and a metal layer 342 formed below the metal core 310 (across the bottom dielectric coating 312) may have a shorter length, which reduces parasitic inductance. Furthermore, in some implementations, the dielectric materials that are used for the dielectric coatings 312 may have a low thermal resistance to enable heat dissipation and/or spreading in the metal core 310, which may be made from a metal that has a high thermal conductivity (e.g., Cu, CuW, or aluminum (Al)). In general, the thermal resistance of the dielectric coatings 312 may be impacted by the thickness of the dielectric coatings 312 and/or the thermal conductivity of the dielectric material used for the dielectric coatings 312. For example, a dielectric coating 312 that includes AlON at a thickness of approximately 20 µm has a high thermal conductivity that exceeds 300 W/mK and a low thermal resistance of approximately 0.06 C/W. In another example, although a dielectric coating 312 that includes AlPO$_4$ has a relatively lower thermal conductivity of approximately 1-1.5 W/mK, the dielectric material AlPO$_4$ offers acceptable thermal resistance values (e.g., minimal thermal insulation) due to having a very small thickness of approximately 0.2-5 µm.

In some implementations, as shown in FIG. 3A, and by reference number 320, the starting structure that includes the metal core 310 with the first dielectric coating 312 on the top side and the second dielectric coating 312 on the bottom side may be processed to form one or more vias and to perform metal plating and patterning on the top and bottom surfaces of the starting structure (e.g., to provide electrical connections between different layers). For example, to form a via 330 that provides an electrical connection to the metal core 310, an opening may be formed in a dielectric coating 312 (e.g., via laser drilling, etching, and/or other suitable techniques) and the opening may then be filled with a metal (e.g., Cu) to form the via 330 that provides an electrical connection to the metal core 310. In some implementations, formation of the via 330 may then be followed by metal plating and patterning on the top and bottom surfaces to form a first metal circuit layer 340 above the metal core 310 and a second metal circuit layer 342 below the metal core, where one or more of the metal circuit layers 340, 342 may be connected to the metal core 310 by a via 330. Additionally, or alternatively, to form a via 332 that provides an electrical connection that is isolated from the metal core 310, an opening may be formed through the metal core 310 and the dielectric coatings 312 on the top and bottom sides of the metal core, and the opening may then be filled with a dielectric epoxy 334 and a metal (e.g., Cu) to form the via 332 through the metal core. In this way, when formation of the via 332 is followed by metal plating and patterning on the top and bottom surfaces to form the first metal circuit layer 340 above the metal core 310 and the second metal circuit layer 342 below the metal core, the via 332 through the metal core 310 and the dielectric coatings 312 may provide an electrical interconnect between the metal circuit layer 340 above the metal core 310 and the metal circuit layer 342 below the metal core 310.

As shown in FIG. 3B, and by example implementation 350, the substrate is generally not restricted to having one metal circuit layer 340 above the metal core 310 and one metal circuit layer 342 below the metal core 310. For example, in some implementations, the starting structure that includes the metal core 310 with the dielectric coatings 312 on the top and bottom sides of the metal core 310 may be processed (e.g., in a similar manner as described above in connection with FIG. 3A) to form one or more vias 330 through a dielectric coating 312 to provide an electrical connection to the metal core 310 and/or one or more one or more vias 332 through the metal core 310 and the dielectric coatings 312 to provide an electrical connection between a metal circuit layer 340 above the metal core 310 and a metal circuit layer 342 below the metal core 310. In some implementations, as described above, the formation of the vias 330, 332 may be followed by metal plating and/or patterning to form a first metal circuit layer 340-1 above the metal core 310 and a first metal circuit layer 342-1 below the metal core 310. In some implementations, additional dielectric coating 312 may then be grown on the first metal circuit layer 340-1 above the metal core 310 and the first metal circuit layer 342-1 below the metal core 310 (e.g., to a thickness below approximately 60 µm, such as 0.2-5 µm for $AlPO_4$ or 10-20 µm for AlON or AlN). In some implementations, one or more additional vias 336 may then be formed in a similar manner (e.g., laser drilling followed by metal filling) to form electrical connections between adjacent metal circuit layers 340/342 (e.g., between the first metal circuit layer 340-1 and a second metal circuit layer 340-2 above the metal core 310 and/or between the first metal circuit layer 342-1 and a second metal circuit layer 342-2 below the metal core 310). Additionally, or alternatively, the vias 332 through the metal core 310 may be subject to further processing (e.g., laser drilling and metal filling) to provide electrical connections between the second metal circuit layers 340-2, 342-2 (and/or metal circuit layers 340-N, 342-N to be formed at higher or lower levels in the stack). In some implementations, additional metal plating and/or patterning may then be performed to form the second metal circuit layers 340-2, 342-2, resulting in the four-metal-layer (4ML) metal-core substrate shown in FIG. 3B.

Accordingly, as described herein, the substrate that is formed from the starting structure that includes the metal core 310 and the thin dielectric coatings 312 may generally include one or more metal circuit layers 340 above the metal core 310 and one or more metal circuit layers 342 below the metal core 310, where each metal circuit layer 340, 342 is separated from the metal core 310 and/or an adjacent metal circuit layer 340/342 by a thin dielectric coating 312 that has a low parasitic inductance to improve electrical performance and a low thermal resistance to improve heat dissipation and heat spreading properties. For example, as described herein, the dielectric coatings 312 are grown on the metal core 310 and/or a metal circuit layer 340/342 to a thickness that is generally less than approximately 60 µm and may be made from materials that have a low thermal resistance based on the thicknesses of the dielectric coatings 312. In this way, the 2ML metal-core substrate shown in FIG. 3A, the 4ML metal-core substrate shown in FIG. 3B, and/or a metal-core substrate with a similar design but a different number of metal circuit layers 340, 342 may receive a chip that requires high speed, a chip that requires a high thermal conductivity, and/or a chip that has an ungrounded bottom (e.g., a chip with minimum of two metal layers and a ground layer, which may be used in a device such as a time-of-flight (ToF) camera). Any such chips may be optical chips, or more specifically VCSEL chips. For example, the substrate designs shown in FIGS. 3A-3B include an ungrounded region that may receive a chip, a grounded region that has a low parasitic inductance, and a low thermal resistance through the region receiving the chip.

For example, in some implementations, the substrate designs shown in FIGS. 3A-3B may be used to receive a VCSEL chip that requires a bottom metal contact (e.g., a cathode layer or die pad) to be disconnected from a ground layer, a higher heat dissipation out of the bottom of the VCSEL chip, and/or high-speed signals. For example, the substrate designs shown in FIGS. 3A-3B may provide electrical isolation from a top metal circuit layer 340 to a ground layer, minimal thermal insulation for heat dissipation through the substrate based on the thickness and thermal conductivity of the dielectric coatings 312, and lower parasitic inductance between the top of the substrate and the ground layer by using thin the dielectric coatings 312 as insulating layers. In general, from top to bottom, the metal layers in the substrate designs shown in FIGS. 3A-3B may alternate between being configured as signal layers and ground layers. For example, in FIG. 3B, the metal circuit layer 340-2 may be a signal layer, the metal circuit layer 340-1 may be a ground layer, metal circuit layers 342-1 and 342-2 may be used for routing, and the metal core 310 may be used for heat dissipation. For example, the substrate designs shown in FIGS. 3A-3B generally include a metal core 310 made from a metal (e.g., Cu, CuW, Al, or the like) having a high thermal conductivity for heat dissipation and/or spreading, vias 330 to the metal core 310, vias 332 across the metal core 310, and/or vias 336 between adjacent metal circuit layers 340/342, and thin dielectric coatings 312 that may be less than 25 μm (e.g., 0.2-5 μm for AlPO$_4$ or 10-20 μm for AlON or AlN) and associated with thermal resistance values and capacitance or parasitic inductance values that satisfy one or more performance thresholds (e.g., depending on one or more factors, such as chip power, operating conditions, application conditions, and/or environmental conditions). For example, the thermal resistance value may satisfy a first threshold and the capacitance or parasitic inductance value may satisfy a second threshold, where the first threshold may be defined to provide thermal properties that ensure sufficient heat dissipation and/or spreading, and the second threshold may be defined to provide electrical properties that ensure sufficient high-speed signal quality.

For example, as described herein, each dielectric coating 312 may separate a metal circuit layer 340 or 342 from the metal core 310 and/or an adjacent metal circuit layer 340 or 342, and may have a thickness below approximately 60 μm to reduce a length of a current loop flowing across the dielectric coating 312 (e.g., between the metal core 310 and a metal circuit layer 340 or 342, between two metal circuit layers 340 above the metal core 310, between two metal circuit layers 342 below the metal core 310, and/or between a first metal circuit layer 340 above the metal core 310 and a second metal circuit layer 342 below the metal core). In this way, by reducing the length of the current loop that flows across the dielectric coating 312, the relatively small thickness of the dielectric coating 312 is associated with a low parasitic inductance. Furthermore, because the dielectric coating 312 has a low thermal resistance (e.g., based on the thickness of the dielectric coating 312 and/or a thermal conductivity of the dielectric material used for the dielectric coating), the dielectric coating 312 can effectively block or insulate an electric current without significantly impacting heat flow vertically into and/or out of the metal core 310.

As indicated above, FIGS. 3A-3B are provided as examples. Other examples may differ from what is described with regard to FIGS. 3A-3B.

Figure 4A:
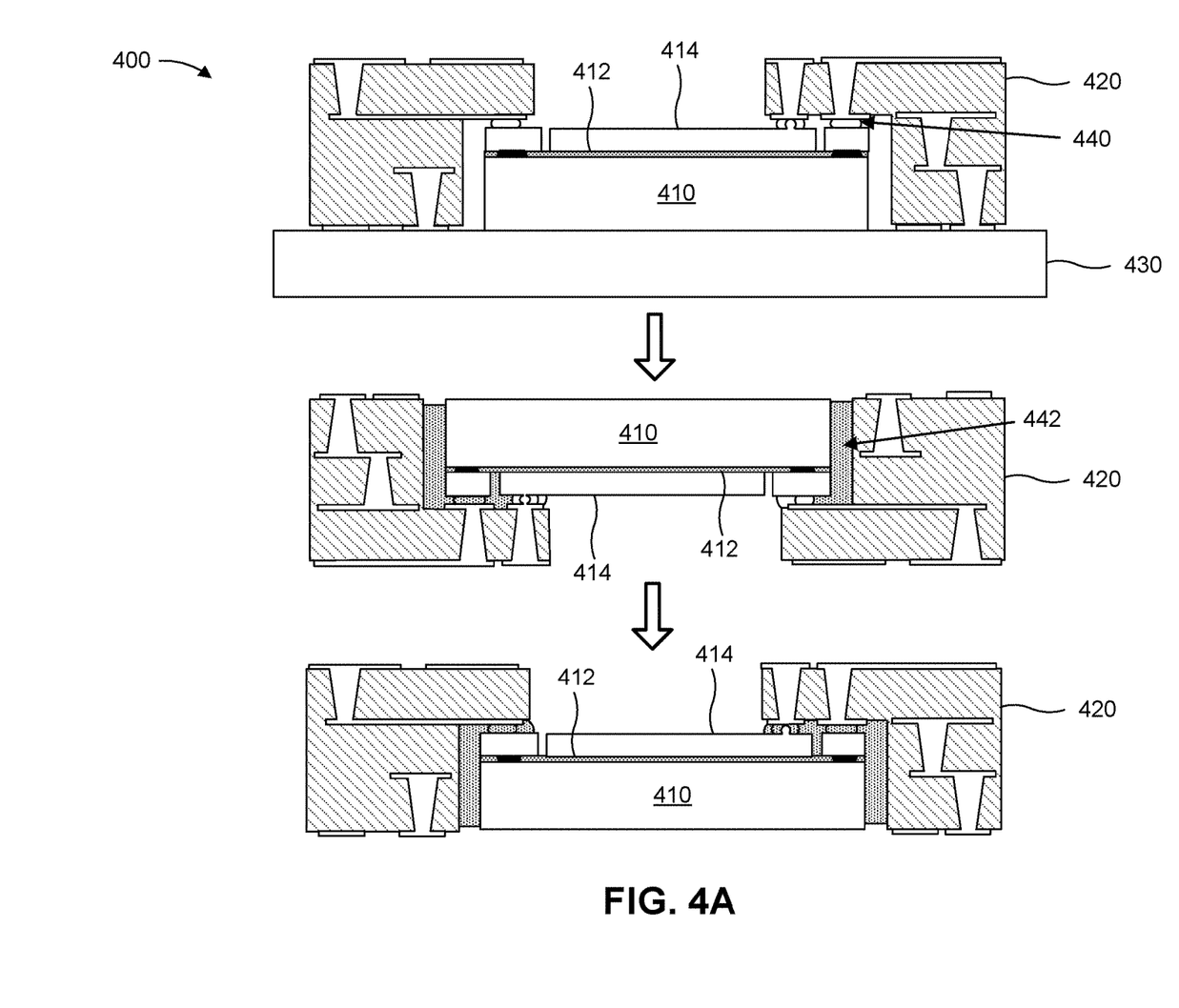
FIGS. 4A-4B are diagrams illustrating example implementations of a package or hybrid substrate that includes a submount with a low thermal resistance and a low parasitic inductance.
Figure 4B:
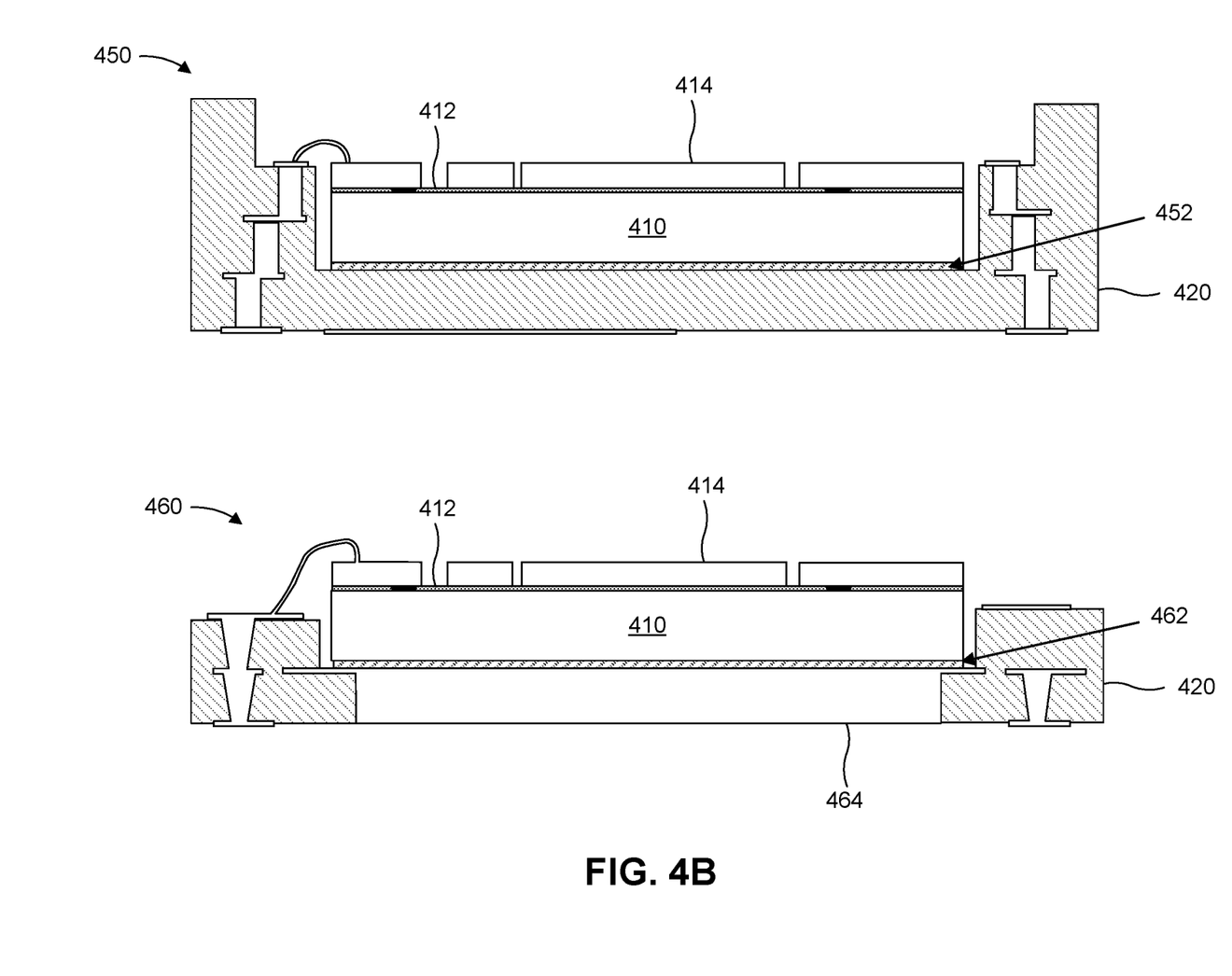

FIGS. 4A-4B are diagrams illustrating example implementations 400, 450, 460 of a package or hybrid substrate that includes a submount with a low thermal resistance and a low parasitic inductance.

For example, as shown in FIGS. 4A-4B, the submount may include a metal base block 410, which may be made from Cu, CuW, Al, or another suitable metal, a thin dielectric coating layer 412 on a top side of the metal base block 410, and a metal circuit layer 414 formed above the dielectric coating layer 412 (e.g., a single-metal-layer (1ML) on top). In some implementations, the dielectric coating layer 412 has a thickness in a range between approximately 0.2 μm and approximately 60 μm. For example, dielectric coating layer 412 may include AlPO$_4$ with a thickness between approximately 0.2-5 μm and/or AlON or AlN with a thickness between approximately 10-20 μm. Accordingly, because the dielectric coating layer 412 is very thin (e.g., less than approximately 60 μm, and potentially as low as 0.2 μm), the dielectric coating layer 412 has a very low parasitic inductance, which is mainly impacted by the thickness of the dielectric coating layer 412. Furthermore, in some implementations, the dielectric coating layer 412 has a low thermal resistance to enable heat dissipation and/or spreading in the metal base block 410, which may be made from a thermally conductive metal (e.g., a metal that has a high thermal conductivity, such as Cu, CuW, or Al). For example, as described above, the thermal resistance of the dielectric coating layer 412 may be impacted by the thickness of the dielectric coating layer 412 and/or the thermal conductivity of the dielectric material used for the dielectric coating layer 412. Accordingly, the dielectric coating layer 412 has parasitic inductance and thermal resistance properties that ensure good electrical performance and heat dissipation and/or heat spreading in a circuit where electrical current and heat flows vertically through the package (e.g., through the submount).

For example, implementation 400 includes a package (e.g., a multi-layer hybrid substrate) in which the metal base block 410 may be used as a grounding layer and a heat dissipation layer. For example, in some implementations, the dielectric coating layer 412 may be grown on the metal base block 410 to a desired thickness, and one or more vias may then be formed in the dielectric coating layer 412 (e.g., by laser drilling followed by metal filling). In some implementations, the one or more vias may be used to connect one or more ground traces to the metal base block 410 such that the metal base block 410 may serve as a grounding layer. In some implementations, metal plating and patterning may then be performed to form the metal circuit layer 414 on the dielectric coating layer 412. As shown in FIG. 4A, the submount may be packaged into a substrate 420, which may be an organic substrate (e.g., an FR4 substrate) and/or an inorganic substrate (e.g., an HTCC substrate). For example, as shown in FIG. 4A, the submount may be placed on a bonding fixture 430, and the substrate 420 may include a cavity to receive the submount and an open window above the cavity (e.g., for emission of a laser). In some implementations, as shown by reference number 440, the submount may be electrically bonded to the substrate 420 by solder paste reflow, Cu-core or plastic-core solder ball reflow, thermal compression bonding of a gold (Au) stud, anisotropic conductive paste bonding, and/or anisotropic conductive film bonding, among other examples. In some implementations, as shown by reference number 442, the structure may then be flipped over and a gap between the submount and the substrate 420 may be filled with an electrically insulative epoxy to increase mechanical strength. In some implementations, the epoxy may be insulative, with a proper Young's modulus to adjust to a coefficient of thermal expansion (C 1E) mismatch between the submount and the substrate 420.

In some implementations, as shown in the bottom diagram of FIG. 4A, the final finished package may include one or more circuit layers electrically connected to the metal circuit layer 414, and the metal base block 410 may serve as a ground and heat dissipation layer. For example, the thin dielectric coating layer 412 may electrically isolate the metal base block 410 used as the ground layer and electrically insulate an electrical current that flows vertically into the cavity region that holds the submount, and the dielectric coating layer 412 has a low parasitic inductance (attributable to the dielectric coating layer 412 having a small thickness) to improve electrical performance for the electrical current. In addition, as described herein, the thickness and/or thermal conductivity of the dielectric coating layer 412 may result in a low thermal resistance, which enables heat to be transferred to the metal base block 410 where the heat can be dissipated or otherwise spread.

FIG. 4B illustrates other example implementations 450, 460 of packages or hybrid substrates that include a submount with a metal base block 410, a single metal circuit layer 414 on top, and a thin dielectric coating layer 412 with a low parasitic inductance and a low thermal resistance to separate the metal circuit layer 414 from the metal base block 410 on the bottom of the submount. In example 450, the submount can be attached into a cavity of a ceramic or inorganic substrate 420 (e.g., an HTCC substrate) by an adhesive 452, such as solder, sintered silver (Ag) epoxy, semi-sintered Ag epoxy, or Ag epoxy, with a ground layer connected by a wire bond. Additionally, or alternatively, in example 460, an adhesive 462 may be used to attach the submount onto a conductive component 464 of an organic substrate 420 (e.g., an FR 4 substrate), with a wire bond connection to the ground layer. For example, in some implementations, the conductive component 464 to which the submount is attached may include a Cu slug, an insert, or a coin of the organic substrate 420.

As indicated above, FIGS. 4A-4B are provided as examples. Other examples may differ from what is described with regard to FIGS. 4A-4B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A substrate, comprising:
a thermally conductive metal core having a top side and a bottom side;
a first dielectric coating on the top side of the metal core;
a second dielectric coating on the bottom side of the metal core,
wherein the first dielectric coating and the second dielectric coating have respective thicknesses that are less than sixty micrometers, and
wherein the first dielectric coating and the second dielectric coating have respective thermal resistances that are less than fifteen degrees Celsius per watt;
a first metal circuit layer formed above the first dielectric coating;
a second metal circuit layer formed under the second dielectric coating; and
a via through the first dielectric coating or the second dielectric coating,
wherein the via is filled with metal to provide an electrical connection to the metal core from the first metal circuit layer or the second metal circuit layer,
wherein one or more electrical currents flowing vertically across one or more of the first dielectric coating or the second dielectric coating, or horizontally along one or more of the metal core, the first metal circuit layer, or the second metal circuit layer, have a low parasitic inductance based on the respective thicknesses of the first dielectric coating and the second dielectric coating, and
wherein the metal core dissipates heat that flows across one or more of the first dielectric coating or the second dielectric coating and into the metal core.

2. The substrate of claim 1, further comprising:
another via through the first dielectric coating, the metal core, and the second dielectric coating,
wherein the other via is filled with metal and a dielectric material to provide an electrical connection from the first metal circuit layer to the second metal circuit layer that is isolated from the metal core.

3. The substrate of claim 1, wherein the first dielectric coating and the second dielectric coating include one or more of aluminum oxynitride (AlON), aluminum nitride (AlN), aluminum oxide (Al2O3), or aluminum phosphate (AlPO4).

4. The substrate of claim 1, wherein the first dielectric coating and the second dielectric coating have respective thicknesses that are less than twenty-five micrometers.

5. The substrate of claim 1, wherein the one or more electrical currents include an electrical current that flows between the metal core and the first metal circuit layer or the second metal circuit layer, and wherein the low parasitic inductance of the electrical current is based on the thickness of the one or more of the first dielectric coating or the second dielectric coating separating the metal core from the first metal circuit layer or the second metal circuit layer.

6. The substrate of claim 1, further comprising:
a third dielectric coating on a top side of the first metal circuit layer;

a third metal circuit layer formed above the third dielectric coating; and one or more additional vias through one or more of the first dielectric coating, the third dielectric coating, or the metal core to provide an electrical connection to the third metal circuit layer.

7. The substrate of claim 1, further comprising:
a third dielectric coating on a bottom side of the second metal circuit layer;
a third metal circuit layer formed below the third dielectric coating; and
one or more additional vias through one or more of the first dielectric coating, the third dielectric coating, or the metal core to provide an electrical connection to the third metal circuit layer.

8. A substrate, comprising:
a metal core having a top side and a bottom side;
a first set of metal circuit layers formed above the top side of the metal core;
a second set of metal circuit layers formed below the bottom side of the metal core,
   wherein each metal circuit layer in the first set of metal circuit layers and the second set of metal circuit layers is separated from at least one of the metal core or an adjacent metal layer by a dielectric layer having a thickness that is less than twenty-five micrometers and a thermal resistance under fifteen degrees Celsius per watt, and
   wherein electrical current and heat flow vertically through the substrate; and
a via through the dielectric layer separating the metal core from a metal circuit layer,
   wherein the via is filled with metal to provide an electrical connection to the metal core from at least one of the first set of metal circuit layers or the second set of metal circuit layers.

9. The substrate of claim 8, wherein the dielectric layer includes aluminum oxynitride (AlON), aluminum nitride (AlN), aluminum oxide (Al2O3), or aluminum phosphate (AlPO4).

10. The substrate of claim 8, further comprising:
another via through the metal core,
   wherein the other via is filled with metal and a dielectric material to provide an electrical connection from a first metal circuit layer above the metal core to a second metal circuit layer below the metal core.

11. The substrate of claim 8, wherein a parasitic inductance of the dielectric layer is based on the thickness of the dielectric layer, and wherein the thermal resistance of the dielectric layer is based on one or more of the thickness of the dielectric layer or a thermal conductivity of a dielectric material used in the dielectric layer.

12. A package, comprising:
a substrate that includes a cavity; and
a submount, bonded to the substrate in the cavity, wherein the submount includes:
   a metal base block;
   a dielectric coating on a top side of the metal base block,
      wherein the dielectric coating has a thickness that is less than sixty micrometers; and
   a metal circuit layer formed above the dielectric coating,
      wherein electrical current and heat flow vertically through the submount; and
   two or more vias through the dielectric coating,
      wherein the two or more vias are filled with metal to provide an electrical connection from the metal circuit layer to the metal base block.

13. The package of claim 12, wherein the dielectric coating includes aluminum oxynitride (AlON), aluminum nitride (AlN), aluminum oxide (Al2O3), or aluminum phosphate (AlPO4).

14. The package of claim 12, wherein the submount is electrically bonded to the substrate by one or more conductive elements.

15. The package of claim 12, wherein the submount is mechanically bonded to the substrate by an electrically insulative epoxy.

16. The package of claim 12, wherein the metal base block is connected to ground and arranged to dissipate the heat that flows through the package.

17. The package of claim 12, wherein the dielectric coating has a thermal resistance under fifteen degrees Celsius per watt.

18. The package of claim 12, wherein the dielectric coating completely covers the top side of the metal base block except at a location of the two or more visa.

19. The substrate of claim 1, wherein at least one of:
the first dielectric coating completely covers the top side of the metal core except at a location of the via, or
the second dielectric coating completely covers the bottom side of the metal core except at a location of the via.

20. The substrate of claim 8, wherein the dielectric layer completely covers at least one of the top side of the metal core or the bottom side of the metal core except at a location of the via.

\* \* \* \* \*